(12) United States Patent
Beier et al.

(10) Patent No.: US 9,689,360 B2
(45) Date of Patent: Jun. 27, 2017

(54) ACTUATOR

(71) Applicant: Robert Bosch GmbH, Stuttgart (DE)

(72) Inventors: Marco Beier, Leonberg (DE); Andreas Rettich, Herrenberg-Kuppingen (DE); Thomas Pauer, Freiberg (DE); Mario Ricco, Casamassima (IT)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/438,909

(22) PCT Filed: Sep. 30, 2013

(86) PCT No.: PCT/EP2013/070327
§ 371 (c)(1),
(2) Date: Apr. 28, 2015

(87) PCT Pub. No.: WO2014/067729
PCT Pub. Date: May 8, 2014

(65) Prior Publication Data
US 2015/0292456 A1 Oct. 15, 2015

(30) Foreign Application Priority Data

Oct. 31, 2012 (DE) .................. 10 2012 219 974

(51) Int. Cl.
*F02M 63/00* (2006.01)
*F02M 51/06* (2006.01)
(Continued)

(52) U.S. Cl.
CPC ...... *F02M 51/061* (2013.01); *F02M 51/0603* (2013.01); *F02M 51/0635* (2013.01);
(Continued)

(58) Field of Classification Search
CPC ............. F02M 51/061; F02M 63/0063; F02M 51/0603; F02M 51/0635; F02M 63/0066;
(Continued)

(56) References Cited

U.S. PATENT DOCUMENTS 4,247,052 A * 1/1981 Gray .................. F02M 51/0685
239/585.2
5,040,514 A * 8/1991 Kubach .................. F02D 41/20
123/298
(Continued)

FOREIGN PATENT DOCUMENTS

CN 1327509 12/2001
CN 101201034 6/2008
(Continued)

OTHER PUBLICATIONS

International Search Report for Application No. PCT/EP2013/070327 dated Jan. 17, 2014 (English Translation, 2 pages).

*Primary Examiner* — Thomas Moulis

(57) ABSTRACT

The invention relates to an actuator (1) comprising a housing (8), a coil (29) and an armature (2) which interacts with a tappet (30) and a spring, the armature plate (3) thereof being arranged to lie opposite an armature counterpiece (16), and said actuator (1) comprising at least one magnetostrictively-active component. According to the invention, an actuator (1) is provided with which large actuating paths can be travelled at high actuating forces. This is achieved by the actuator (1) additionally being designed to act as a solenoid.

13 Claims, 2 Drawing Sheets

(51) Int. Cl.
  *H01L 41/12* (2006.01)
  *H02N 2/02* (2006.01)
  *H01F 7/16* (2006.01)
  *H01L 41/06* (2006.01)
(52) U.S. Cl.
  CPC .... *F02M 63/0063* (2013.01); *F02M 63/0066* (2013.01); *H01F 7/1607* (2013.01); *H01L 41/06* (2013.01); *H01L 41/12* (2013.01); *H02N 2/02* (2013.01); *F02M 2200/50* (2013.01); *F02M 2200/704* (2013.01)
(58) Field of Classification Search
  CPC .......... F02M 2200/50; F02M 2200/704; H01F 7/1607; H01L 41/06; H01L 41/12; H02N 2/02
  USPC ........................................................ 123/498
  See application file for complete search history.

(56) References Cited

U.S. PATENT DOCUMENTS

| | | | |
|---|---|---|---|
| 5,645,226 A | 7/1997 | Bright | |
| 6,113,014 A * | 9/2000 | Coldren | F02D 41/20 239/585.1 |
| 6,460,779 B1 | 10/2002 | Boecking | |
| 8,683,982 B2 * | 4/2014 | Bright | F02M 51/0603 123/490 |
| 2005/0274820 A1 * | 12/2005 | Bright | F02M 47/027 239/102.2 |
| 2007/0007363 A1 * | 1/2007 | Mifuji | F02M 51/0607 239/102.2 |
| 2007/0284456 A1 * | 12/2007 | Tsuchiya | F02M 51/0603 239/102.2 |
| 2011/0148553 A1 * | 6/2011 | Pantke | H01F 7/17 335/215 |

FOREIGN PATENT DOCUMENTS

| | | | |
|---|---|---|---|
| DE | 19843534 | 3/2000 | |
| DE | 10317149 | 10/2004 | |
| EP | 2000661 | 12/2008 | |
| JP | EP 1965064 A2 * | 9/2008 | ............ F02D 41/20 |

* cited by examiner

ACTUATOR

BACKGROUND OF THE INVENTION

The invention relates to an actuator, having a housing, a coil, an armature which interacts with a tappet and a spring, and of which the armature plate is arranged opposite an armature counterpiece, and wherein the actuator has at least one magnetostrictively acting component. The invention further relates to a method for operating an actuator of this kind.

An actuator of this kind is known from DE 198 43 534 A1. This actuator is installed on a fuel injector for an internal combustion engine. In this case, the magnetostrictive actuator is screwed to the side of the fuel injector and, by means of a hydraulic fluid, transmits a movement which is executed by the actuator to the valve needle of the fuel injector. To this end, a transmitter plunger is additionally arranged between the actuator and the space which accommodates the hydraulic liquid. Overall, the actuator, which is formed in this way and has the fuel injection valve, is of complicated construction, wherein the possible movement distance of the valve needle is furthermore small.

SUMMARY OF THE INVENTION

The object of the invention is to specify an actuator and a method for operating an actuator, with which actuator and method large actuating travel distances can be realized at high actuating forces.

This object is achieved in that the actuator is additionally designed as a solenoid. The method according to the invention is distinguished in that, when current is applied to the coil, a magnetic flux forms across the armature, the tappet, a sliding piece and the housing, the magnetostrictive tappet being extended by said magnetic flux, and, after a limit extension is reached, the attraction force between the armature plate and the armature counterpiece is large enough to move the armature, together with the tappet and the sliding piece, to bear against the armature counterpiece. In this case, the actuator additionally acts as a solenoid. The particular advantage of the invention therefore lies in the combination of a magnetostrictive actuator or magnetostrictively acting actuator with a solenoid, wherein the two actuator concepts share a magnetic circuit. Several advantages are achieved as a result. Only one coil is required, as a result of which the installation space requirement for the actuator is low overall. The number of components is likewise low. The magnetostrictive actuator has to cover only a small actuating travel distance, and therefore said magnetostrictive actuator can be of small design overall. Finally, the force profile of the actuator combination which is designed in this way can be better matched to corresponding requirements. Therefore, in summary, an actuator is provided which is able to realize large actuating travel distances at high actuating forces together with a clear structure and low costs.

In one development of the invention, the tappet is of magnetostrictive design. Magnetostriction is the deformation of magnetic (in particular ferromagnetic) substances as a result of a magnetic field being applied. In the process, the body, in the present case the tappet, experiences an elastic change in length at a constant volume. Suitable materials for the tappet include materials with a high degree of magnetostriction, for example Terfenol or iron/nickel alloys.

In a further refinement of the invention, the tappet is arranged between the armature and, on the opposite side, a sliding piece. When current is applied to the coil, the tappet extends and displaces the armature ultimately as far as a limit extension amount in relation to the sliding piece which is supported in a manner fixed to the housing.

In one development of the invention, the armature and the sliding piece are connected to one another by means of a spring which surrounds the tappet. The spring applies the necessary pretension to the tappet. In a further refinement, the spring is in this case designed as a sleeve spring which is additionally a tension spring. The sleeve spring is fixedly connected to the armature and to the sliding piece and clamps the tappet between said components with a defined force.

In one development of the invention, the sliding piece is of cylindrical design and is guided in a recess in the housing. Firstly, this results in the assembly, comprising the sliding piece, the tappet, the armature and the sleeve spring, being guided, and secondly, a low-loss magnetic flux is ensured by the guidance.

In one development of the invention, the coil is arranged in the housing so as to surround at least the tappet and the spring. In the process, the coil can further also surround a subregion in each case of the armature and of the sliding piece in order to exert a force, which is as constant as possible, on the components even during the intended movements of the components.

In one development of the invention, the armature interacts with a coupler rod opposite the tappet. In the process, the coupler rod is preferably connected to the armature plate and guided through an opening in the armature counterpiece. In the process, the coupler rod transmits the corresponding movement to the components which are to be moved, and, furthermore, the movable components are guided on the opposite side to the sliding piece. In one development of the invention, the component which is to be operated is a fuel injector of an injection system for an internal combustion engine. In this case, the actuator which is designed in this way is advantageously to be integrated into the housing of a fuel injector of this kind.

BRIEF DESCRIPTION OF THE DRAWINGS

Further advantageous refinements of the invention can be found in the description of the drawings in which one exemplary embodiment of the invention which is illustrated in the drawing is described in greater detail.

In the drawings.

DETAILED DESCRIPTION

Figure 1:
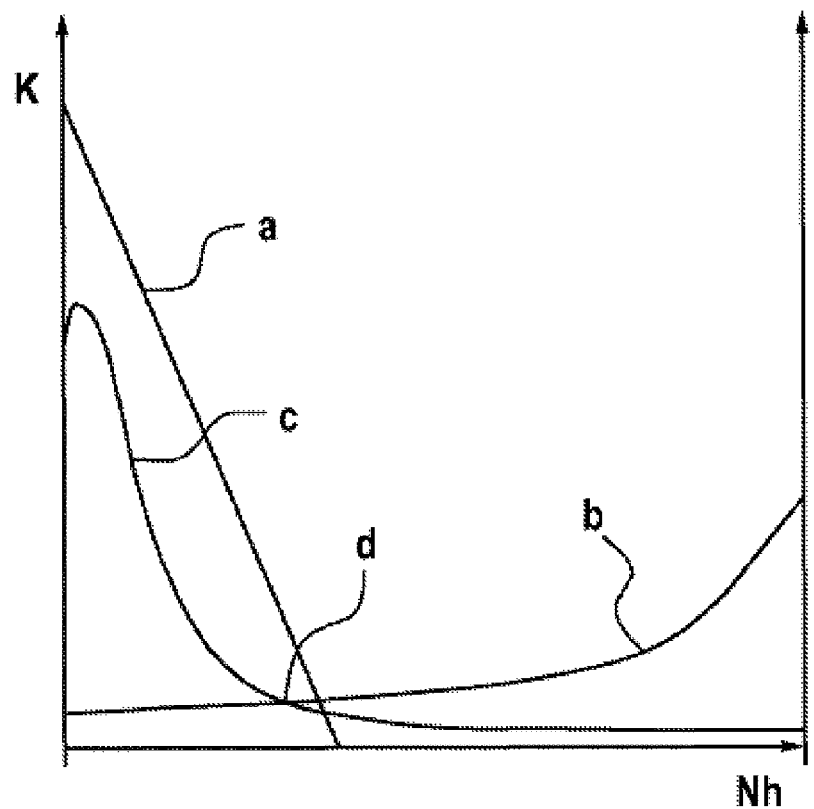
FIG. 1 shows a force/distance graph of various force profiles of actuators and a force profile which is necessary for moving a valve needle.

FIG. 1 shows a force/distance graph with various force profiles or stroke profiles of different actuators and a typical hydraulic force profile which has to be exerted on a valve needle of a fuel injector in order to move said valve needle.

In the graph, the needle stroke Nh (or actuating travel distance) of a valve needle, which needle stroke corresponds to an air gap, which is to be overcome, in a (magnetic) actuator, is plotted on the abscissa, and the force K is plotted on the ordinate. The characteristic curve a indicates the typical force profile of a magnetostrictive actuator which, starting from a high initial force and a then linearly decreasing force, covers only a small overall actuating travel distance. The characteristic curve b indicates the typical force profile of a magnetic lifting actuator (solenoid) which, starting from a low initial force, exhibits an increasing increase in force with a large overall actuating travel distance. The characteristic curve c identifies a typical hydraulic force profile which has to be exerted on the valve needle 6, illustrated in FIG. 2, of a fuel injector 5 in order to move said valve needle. In the event of a combination of the two actuators having the characteristic curves a and b, a change-over point d from a magnetostrictive actuator to a solenoid is produced at the point at which the characteristic curves c and b intersect. It is further clear that the combination according to the invention of a magnetostrictive actuator and a solenoid always generates a force which is considerably higher than the force which is necessary for moving the valve needle 6.

Figure 2:
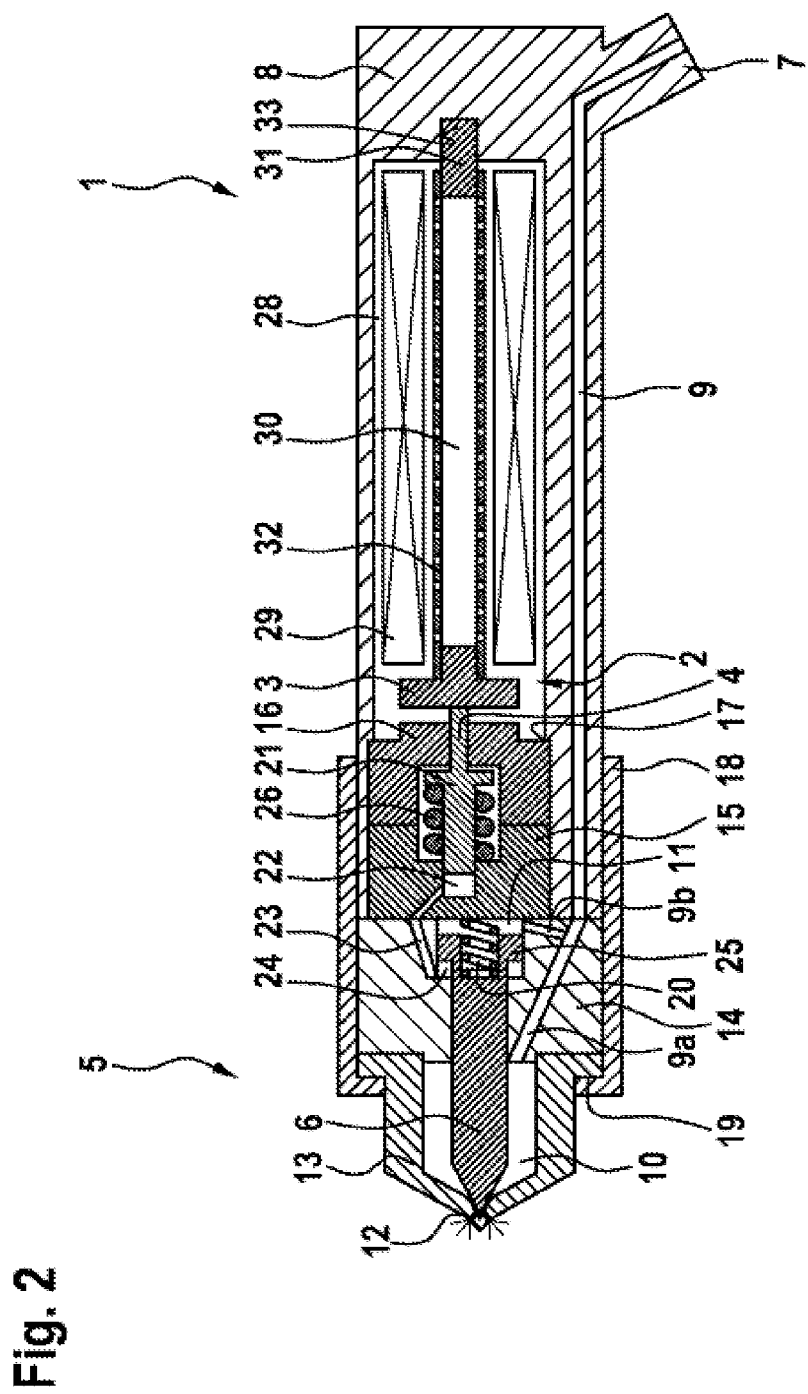
FIG. 2 shows an actuator which is designed according to the invention and is installed on a fuel injection valve.

In the illustrated exemplary embodiment, the actuator 1, illustrated in FIG. 2, is connected to a fuel injector 5, but, in principle, can also be connected to any other desired devices or components in which an associated component is intended to be moved. The fuel injector 5 is part of a common rail injection system with which fuel, in particular diesel fuel, is intended to be injected into an associated combustion space of a preferably self-igniting internal combustion engine under high pressure.

To this end, fuel is supplied to the fuel injector 5 via a high-pressure line which is arranged by way of a high-pressure line connection 7 on a common housing 8 of the actuator 1 and of the fuel injector 5. The high-pressure line connection 7 is connected to a valve needle space 10 and a control space 11 via connecting channels 9, 9a, 9b. In the illustrated position of the valve needle 6, injection openings 12 through which the fuel, which is located in the valve needle space 10, can be injected into the combustion space are closed by a valve needle tip of the valve needle 6. The injection openings 12 are arranged in a valve needle body 13 which interacts with a valve body 14. For its part, the valve body 14 interacts with an intermediate piece 15 which adjoins an armature counterpiece 16. The intermediate piece 15 and the armature counterpiece 16 are inserted into the housing 8 and the armature counterpiece 16 is supported on a projection 17 in the housing 8. Said components are braced to one another by a union nut 18, wherein the union nut 18 is supported by way of a ring projection 19 on the valve needle body 13 and is screwed onto the housing 8 by way of the opposite end region.

The valve needle 6 is pushed into the position in which it closes the injection openings 12 by a valve needle spring 20 which is arranged in the region of the control space 11 and is supported on the valve needle 6 and the intermediate piece 15. At the same time, an additional closing force to that provided by the valve needle spring 20 is exerted on the valve needle 6 by the high fuel pressure prevailing in the control space 11 and the valve needle space 10, supported by a step projection 25 on the valve needle 6.

The injection openings 12 which are controlled by the valve needle 6 are opened when the valve needle 6 is moved in the direction of the intermediate piece 15. A movement of this kind is executed when a coupler rod 22 which is guided through an opening in the armature counterpiece 16 is moved by the actuator 1 in the direction of the control space 11 and fluid, in particular fuel, which is located in an actuator space 22 is conveyed to a valve needle control space 24 by a connection 23. The valve needle control space 24 is arranged opposite the control space 11 on the step projection 25 of the valve needle 6 and, when the pressure in the valve needle control space 24 is high enough, the valve needle 6 is pushed in the direction of the intermediate piece 15 against the force of the valve needle spring 20 and the fuel pressure prevailing in the control space 11. The injection operation which is initiated in this way is terminated by the fluid pressure in the valve needle control space 24 being lowered and the force which is exerted by the valve needle spring 20 and the fuel pressure in the control space 11 being greater than the forces prevailing in the valve needle control space 24 and the valve needle space 10. This state is produced by corresponding driving and, respectively, disconnection of the actuator 1.

The coupler rod 21 is pushed against the armature plate 3 by a coupler rod spring 26 and can be guided, for example, in a recess in the armature plate 3 in order to fix the armature plate 3 in position.

The actuator 1 has a space 28 which is made in the housing 8 and which accommodates the components of the actuator 1. In particular, a coil 29 is arranged and secured in a suitable manner in the space 28. The coil 29 is connected in a switchable manner to a voltage source via connection lines. Within the coil 29, a tappet 30 which is produced from a magnetostrictive material is arranged between the armature 2 and an opposite sliding piece 31. The armature 2 is connected to a sleeve spring 32 by way of the sliding piece 31 with the inclusion of the tappet 30, said sleeve spring exerting a required pretension on the tappet 30. The sliding piece 31 is guided in a movable manner in a recess 33 in the housing 8. This guidance of the sliding piece 31 in the recess 33 produces an at least low-loss magnetic circuit, comprising the armature counterpiece 16, the armature 2, the magnetostrictive tappet 30, the sliding piece 31 and the housing 8, when current is applied to the coil 29. At the same time, the guidance of the sliding piece 31 in the recess 33 causes guidance of the tappet 30 together with the armature 2.

If current is applied to the coil 29, a magnetic flux initially forms across the tappet 30, the armature 2, the housing 8 and the sliding piece 31. This flux generates an attraction force between the armature 2 and the armature counterpiece 16, but this attraction force is not large enough to ultimately lift the valve needle 6 from the seat in order to open the injection openings 12. The magnetostrictive tappet 30 wants to extend owing to the generated magnetic field. This extension is impeded by the force which acts on the valve needle 6 by means of the valve needle control space 24 and the actuator control space 22 and the coupler rod 21 on the armature 2. This leads to a pressure force in the magnetostrictive tappet 30. The tappet 30 will be extended until an equilibrium is established between the pressure force in the tappet 30 and the force on the coupler rod 21. This results in a reduction in volume in the actuator control space 22, wherein the displaced fluid is pushed into the valve needle control space 24 through the connection 23. As a result, the valve needle 6 is lifted out of the seat. When the valve needle 6 has completed a sufficient stroke, the attraction force between the armature 2 and the armature counterpiece 16 is large enough to move the components armature 2, tappet 30, sliding piece 31 and sleeve spring 32. In this state, the actuator 1 (additionally) acts as a solenoid. This movement is converted by the actuator control space 22 and the valve needle control space 24 into a further movement of the valve needle 6. Force can be decreased or increased by means of the area ratios in the actuator control space 22 and the valve needle control space 24. The injection operation which is initiated in this way is terminated by current not being applied to the coil 29, and accordingly the armature 2 together with the tappet 30 and the sliding piece 31 being moved back to the illustrated starting position. As a result, the pressure in the valve needle control space 24 is reduced and the valve needle 6 is moved back to the position in which it closes the injection openings 12.

The invention claimed is:

1. An actuator (1), having a housing (8), a coil (29), an armature (2) which interacts with a magnetostrictive tappet (30), and of which an armature plate (3) is arranged opposite an armature counterpiece (16), characterized in that the actuator (1) is additionally a solenoid and the magnetostrictive tappet and the solenoid share a magnetic circuit.

2. The actuator (1) as claimed in claim 1, characterized in that the tappet (30) is arranged between the armature (2) and, on an opposite side, a sliding piece (31).

3. The actuator (1) as claimed in claim 2, characterized in that the armature (2) and the sliding piece (31) are connected to one another by a spring which surrounds the tappet (30).

4. The actuator (1) as claimed in claim 3, characterized in that the spring is a sleeve spring (32).

5. The actuator (1) as claimed in claim 3, characterized in that the spring is a tension spring which exerts a pretension onto the tappet (30).

6. The actuator (1) as claimed in claim 2, characterized in that the sliding piece (31) is cylindrical and is guided in a recess (33) in the housing (8).

7. The actuator (1) as claimed in claim 1, characterized in that the coil (29) is arranged in the housing (8) so as to surround at least the tappet (30) and the spring.

8. The actuator (1) as claimed in claim 1, characterized in that the armature (2) interacts with a coupler rod (21) opposite the tappet (30).

9. The actuator (1) as claimed in claim 8, characterized in that the coupler rod (21) is guided through an opening in the armature counterpiece (16).

10. A fuel injector (5) comprising an actuator (1) as claimed in claim 1.

11. A method for operating an actuator, having a housing (8), a coil (29), an armature (2) which interacts with a tappet (30) and a spring and of which an armature plate (3) is arranged opposite an armature counterpiece (16), wherein the tappet is magnetostrictive, wherein, when current is applied to the coil (29), a magnetic flux forms across the armature (2), the tappet (30), a sliding piece (31) and the housing (8), the magnetostrictive tappet (30) being extended by said magnetic flux, and wherein, after a limit extension is reached, an attraction force between the armature plate (3) and the armature counterpiece (16) is large enough to move the armature (2), together with the tappet (30) and the sliding piece (31), to bear against the armature counterpiece (16) in the manner of a solenoid.

12. An actuator having a housing, a single coil, an armature which interacts with a magnetostrictive tappet, and a spring, and of which an armature plate is arranged opposite an armature counterpiece, and wherein the coil is configured to act on both the magnetostrictive tappet and the armature.

13. The actuator of claim 12, wherein the actuator is configured such that when current is applied to the coil, a magnetic flux forms across the armature, the magnetostrictive tappet, and the housing, the magnetostrictive tappet being extendable by said magnetic flux, and wherein the actuator is further configured such that after a limit extension is reached, the attraction force between the armature plate and the armature counterpiece is sufficient to move the armature, together with the magnetostrictive tappet, to bear against the armature counterpiece.

* * * * *